US006829263B1

United States Patent
Richter et al.

(10) Patent No.: US 6,829,263 B1
(45) Date of Patent: Dec. 7, 2004

(54) SEMICONDUCTOR LASER

(75) Inventors: Hartwig Richter, Darmstadt (DE); Manfred Becker, Berlin (DE)

(73) Assignee: Deutsche Telekom AG, Bonn (DE)

( * ) Notice: Subject to any disclaimer, the term of this patent is extended or adjusted under 35 U.S.C. 154(b) by 0 days.

(21) Appl. No.: 09/529,700

(22) PCT Filed: Sep. 28, 1998

(86) PCT No.: PCT/EP98/06144

§ 371 (c)(1),
(2), (4) Date: Apr. 18, 2000

(87) PCT Pub. No.: WO99/21251

PCT Pub. Date: Apr. 29, 1999

(30) Foreign Application Priority Data

Oct. 18, 1997 (DE) .......................... 197 46 204

(51) Int. Cl.[7] .............. H01S 3/10; H01S 5/02
(52) U.S. Cl. .......................... 372/36; 372/34
(58) Field of Search .................. 372/34, 36, 32

(56) References Cited

U.S. PATENT DOCUMENTS

| 5,140,605 A | 8/1992 | Paoli et al. ............... 372/50 |
| 5,680,410 A | * 10/1997 | Kim et al. ............... 372/34 |

FOREIGN PATENT DOCUMENTS

| DE | 42 32 326 | 3/1994 |
| DE | 42 32 327 | 3/1994 |
| DE | 195 46 443 | 6/1997 |
| EP | 0 779 526 A3 | 6/1997 |
| EP | 0 779 526 A2 | 6/1997 |
| FR | 2 656 093 | 6/1991 |
| JP | 57 149784 | 9/1982 |
| JP | 60 015987 | 1/1985 |
| JP | 61 247083 | 11/1986 |
| JP | 01 037893 | 2/1989 |
| JP | 01 216586 | 8/1989 |
| JP | 01 245585 | 9/1989 |

OTHER PUBLICATIONS

K.H. Park, "Fabrication and Transmission Experiments of Distributed Feedback Lasers Modules for 2.5 Gb/s Optical Transmission Systems," published in Optical and Quantum Electronics 27 (1995), 547–552.
*Richter, "Chips mit Zukunftpotential," [Chips with Future Potential], interim results of the Telekom Research Project OEIC, Telekom Vision 7/93, pp. 41–47.

* cited by examiner

*Primary Examiner*—James W. Davie
(74) *Attorney, Agent, or Firm*—Kenyon & Kenyon

(57) ABSTRACT

In a semiconductor laser, at least one temperature sensor is disposed directly on or integrated in a semiconductor laser chip for measuring an operating temperature. Precisely and/or locally solved measurement of the operating temperature of the laser are possible. One or more temperature sensors may be placed and fastened directly onto the laser chip or in a hole of the laser chip by welding, especially with Nd-YAG-laser light or light with similar characteristics. Fine equalization of temperature may be carried out, for example, by Peltier elements, components of the Peltier elements being mounted directly onto the laser chip. A cascaded arrangement of thermoelements and Peltier elements on a laser chip is also provided for.

34 Claims, 7 Drawing Sheets

1

SEMICONDUCTOR LASER

FIELD OF THE INVENTION

The present invention relates to a semiconductor laser in general, and, particular, to a semiconductor laser including a semiconductor laser chip and at least one temperature sensor secured directly to or integrated in the semiconductor laser chip.

RELATED TECHNOLOGY

Semiconductor lasers are generally known, as proceeds, for example, from the publication by H. Richter, TelekomVision 7/93, Chips mit Zukunftspotential" [Chips with Future Potential], interim results of the Telekom Research Project OEIC, TelekomVision 7/93, pp. 41 through 47, which is hereby incorporated by reference herein.

The application of such a laser is described in detail in the publication by K. H. Park, "Fabrication and Transmission Experiments of Distributed Feedback Lasers Modules for 2.5 Gb/s Optical Transmission Systems" published in Optical and Quantum Electronics 27 (1995), 547–552. To further enhance capacity, optical carrier frequency technologies, also referred to as wavelength division multiplex systems, are increasingly being used. The output wavelength of the semiconductor lasers used in these systems must be able to be adjusted and corrected within a very narrow range. Manipulated variables used for this purpose include the externally adjusted temperature of the laser carrier, and the laser's pumping power.

At a constant pumping power, an incorrect determination of the temperature of the laser chip leads to deviations in the output wavelengths, particularly when it is necessary to change the pumping power for operational reasons. The reasons for a change in pumping power can be unplanned, such as the effects of ageing on the laser, or also planned, such as changing the laser's output power in response to a change in path attenuation, or subsequent to a reconfiguration in switched networks (routing, equivalent line circuit).

While in telecommunications lasers the emphasis is on a monomode characteristic and a small line width, as well as a rapid modulability, for purposes such as material processing, it is important that the semiconductor laser have a high power output. In comparison to telecommunications lasers, high-performance lasers are often very long (up to 2 mm). Unavoidable irregularities due to manufacturing, along the active laser zone, lead to local temperature peaks, particularly in operations entailing the highest power outputs. Such irregular temperature distribution results in a diminished output power and, in the extreme case, to irreversible degradation of the laser.

In known methods heretofore, a laser's temperature is only measured at one location, namely at its laser carrier being used as a heat sink. When measuring the temperature, errors can occur due to the heat transfer resistance between the laser chip and the heat sink, and also due to the finite thermal conductivity of the laser chip material; in addition to this such errors are caused by other heat sources produced by the bulk resistances in the pumping current's circuit path. Besides the steady-state temperature measuring errors, large time constants also result, which adversely affect temperature control. In known methods heretofore, irregularities in the temperature characteristic were not recorded at all in the case of high-performance lasers. German Patent No. DE 19 546 443 and European Patent No. EP 0 779 526, which are hereby incorporated by reference herein, describe an optical and/or electro-optical connection, and a method for manufacturing such a connection for two optical and/or electro-optical components. FIG. 7 of European Patent No. EP 0 779 526, in particular, shows how a pump-current lead wire is secured in a semiconductor laser, and provides details of the same in the corresponding description. It also describes how a hole can be bored into a laser chip using laser welding light.

Other laser chips or semiconductor laser modules are fundamentally described in German Patent No. DE 42 32 326 and in German Patent No. DE 42 32 327.

As noted above, it is customary for the temperature of a laser to be measured at only one location, namely at its laser carrier being used as a heat sink.

SUMMARY OF THE INVENTION

An object of the present invention is to provide an arrangement of a temperature sensor or of a plurality of temperature sensors, which will enable a more precise and/or locally resolved measurement of the operating temperature, it also being possible to implement a precise temperature adjustment with substantial accuracy and/or local selectivity.

The present invention provides a semiconductor laser including a semiconductor laser chip and at least one temperature sensor disposed directly on or integrated in the semiconductor laser chip for measuring an operating temperature. A very high precision, not attainable in known methods heretofore, is achieved by securing one or a plurality of temperature sensors directly onto the laser chip, and in intimate connection with the same, in a welding operation using Nd-YAG laser light or light having similar properties. The fine temperature adjustment is advantageously carried out using Peltier elements, the components of the Peltier elements being applied directly to the laser chip using Nd-YAG laser light. In accordance with the present invention, the wavelength of the laser chip is measured and, when necessary, the wavelength of the laser chip is also adjusted, the telecommunications lasers having one measuring point per active laser zone, and the high-performance lasers having a plurality of measuring points per laser chip along the active laser zone.

Other advantages, features, and possible applications of the present invention are revealed below.

BRIEF DESCRIPTION OF THE DRAWINGS

The present invention shall be elucidated with reference to the drawings, in which.

DETAILED DESCRIPTION

Figure 1:
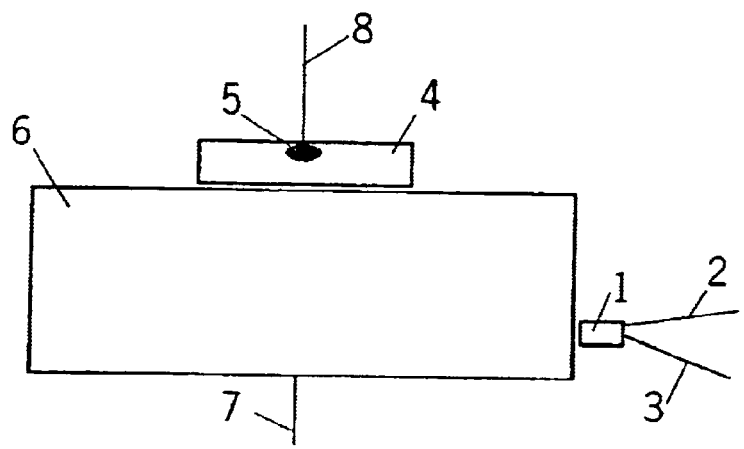
FIG. 1 a schematic diagram of a semiconductor laser chip in accordance with the related art.

FIG. 1 shows the design of a known laser chip, as described, for example, in H. Richter, "*Chips mit Zukunftspotential*" [Chips with Future Potential], discussed above. Up until now, a laser's temperature has typically been measured at one location, namely at its laser carrier that is used as a heat sink. In this context, a temperature sensor 1, together with its lead wires 2 and 3, is mounted on heat sink 6. Semiconductor laser chip 4, also referred to simply as laser chip, receives a pumping current at its active laser zone 5 via wires 7 and 8 that supply the pumping current. As already described at the outset, an arrangement of this kind has the following disadvantages: the difference between the temperature of semiconductor laser chip 4, which is also determinative for the output wavelength of the laser, and the externally adjusted temperature of heat sink 6, is not recorded. The temperature difference is caused by the heat transfer resistances between laser chip 4 and the laser carrier or heat sink 6, as well as by the finite thermal conductivity of the laser chip material. The bulk resistances in the pumping current circuit are also a source of heat. The result is not only steady-state measuring errors of temperature, but large time constants as well, which have an adverse effect on a temperature control.

Figure 2:
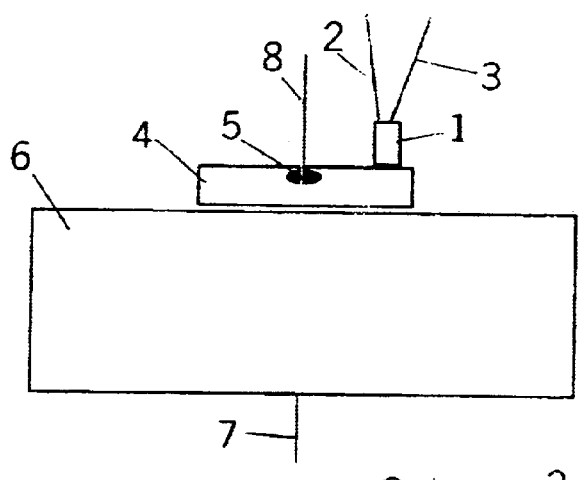
FIG. 2 a schematic diagram of an arrangement and mounting of a known sensor on the laser chip.

FIG. 2 illustrates how an already known temperature sensor 1 can be applied by welding using laser light to laser chip 4. The remaining design of the arrangement according to FIG. 2 corresponds to that of FIG. 1. Melting points 10 formed using this welding method secure temperature sensor 1 to laser chip 4, as shown in FIG. 3.

Figure 3:
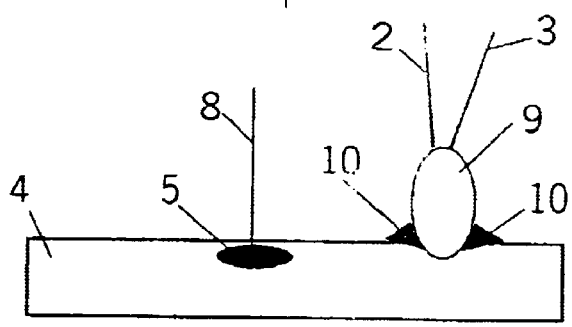
FIG. 3 a schematic diagram of a sensor encapsulated in glass.

According to the specific requirements, it can be necessary and/or also advantageous to encapsulate temperature sensor 1, before applying it to laser chip 4, in a thermally conductive, easily weldable material 9, for example glass, as shown in FIG. 3. The remaining design corresponds again to that already described previously, however heat sink 6 of semiconductor laser 4 is not shown, since the intention here is to merely show the arrangement of an encapsulated temperature sensor 1.

Figure 4:
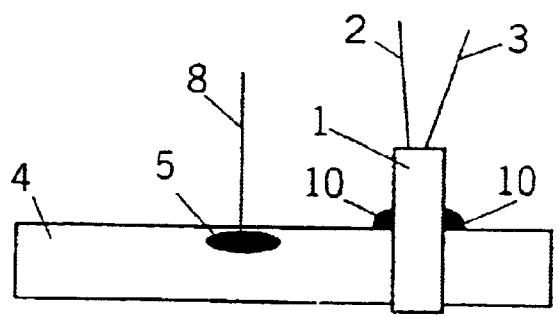
FIG. 4 a schematic diagram of a semiconductor laser chip having a hole bored by laser welding light.

FIG. 4 depicts such a temperature sensor 1 in a predrilled hole. Shown here, again, is laser chip 4 having wire 8 for supplying pumping current, as well as wires 2 and 3 for suppling measuring current to temperature sensor 1. Also shown, are wires 2 and 3 for supplying measuring current to temperature sensor 1.

To produce the hole for temperature sensor 1 in laser chip 4, laser light radiation can likewise be used, as described in German Patent No. DE 19 546 443.

At this point, it should be remarked that the described method for arranging one or a plurality of temperature sensors, as well as the fine temperature adjustment characterized by high precision and/or local selectivity with respect to temperature is easily applicable to laser chips of thermally isotropic material.

Figure 5A:
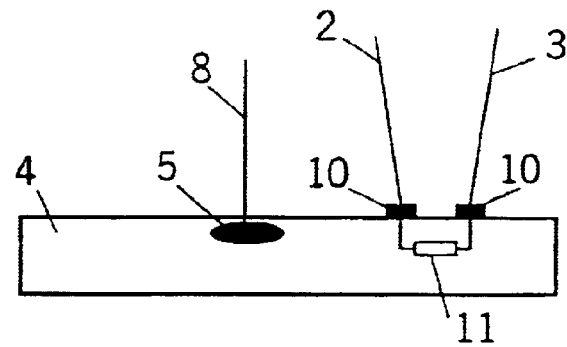
FIG. 5a a schematic diagram of an arrangement having a bulk resistor as a sensor.
Figure 5B:
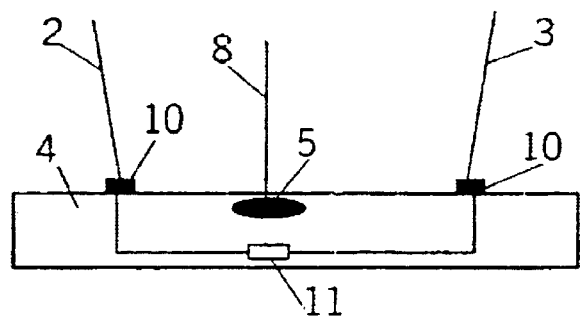
FIG. 5b a schematic diagram of an arrangement having a symmetrical sensor.
Figure 6:
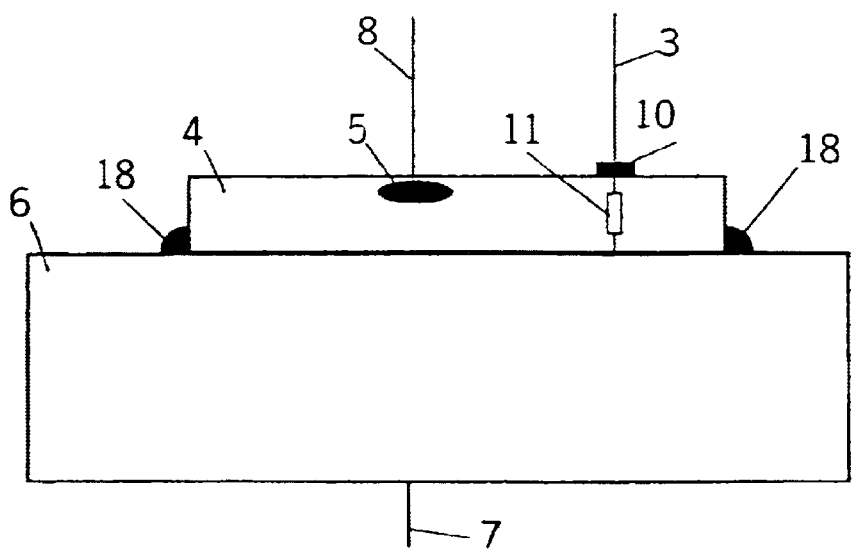
FIG. 6 a schematic diagram of a representation of the bulk resistance in parallel to the pumping current circuit.

The arrangements in accordance with FIGS. 5a, 5b and 6 enable the temperature dependency of bulk resistor 11 itself to be measured. The resistor is apparent between the two melting points 10, where the two wires 2 and 3 for supplying measuring current are mounted by welding or another method, for example bonding. Also shown are lead wires 2 and 3 for the measuring current and lead wire 8 for the pumping current.

FIG. 5b shows an arrangement having symmetrical sensors, individual laser 5 being configured symmetrically between melting points 10 in laser chip 4. Here, bulk resistor 11 is again disposed between the two measuring points 10.

FIG. 6 illustrates that bulk resistor 11 is arranged in parallel to the pumping current circuit, here again, heat sink 6 being connected to laser chip 4 by melting points 18 formed during welding. Heat sink 6 is connected by a wire 7 for supplying the pumping current, and individual laser 5 is likewise connected by a wire 8 for supplying the pumping current. Wire 3 is connected to melting point 10, to be able to supply the necessary measuring current.

The need is eliminated here for second melting point 10 for wire 2; instead, wire 7 or wire 8 can be jointly used.

Figure 7:
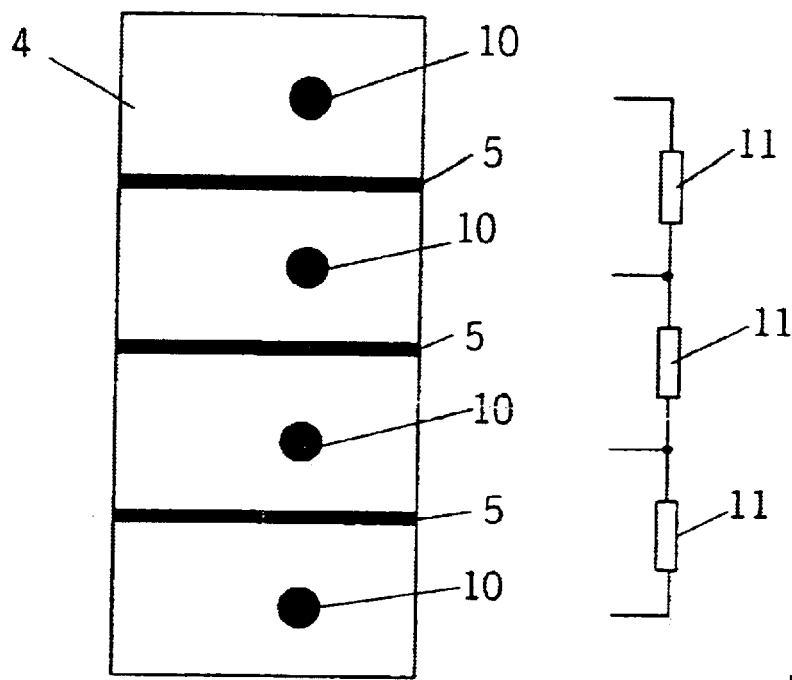
FIG. 7 a schematic diagram of an arrangement for measuring the temperature of individual lasers using bulk-resistance sensors.

Measuring the temperature of individual lasers 5 having bulk-resistance sensors is illustrated in FIG. 7. The individual bulk resistors 11 are disposed between melting points 10 of individual lasers 5, which are located on or in a laser chip 4. This demonstrates that when a plurality of individual lasers 5 are configured on one laser chip 4, the temperature of each individual laser 5 can be measured. As a result, it is possible to adjust the output wavelengths of these individual lasers 5 during operation, by way of their pumping currents, without explicitly measuring their wavelength.

Figure 8:
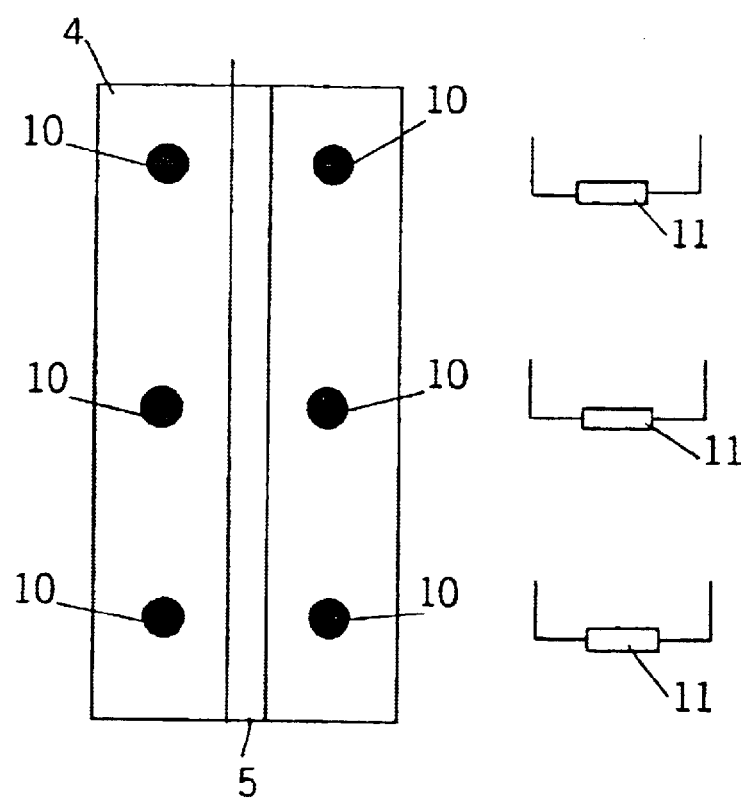
FIG. 8 a schematic diagram of an arrangement for measuring temperature irregularity using bulk-resistance sensors.

A similar technology (FIG. 8) makes it possible, when working with high-performance lasers, to measure the temperature distribution along an active-laser zone of an individual laser 5 on or in laser chip 4.

Particular advantages are derived when temperature sensor 1 is a thermoelement. It is then not only possible to secure a previously fabricated thermoelement using laser-light welding, directly onto the measuring object, in close thermal contact with the same, as already described, but it is also possible, in one work step, to join the two individual wires required for the thermoelement, using laser-light welding, to form one thermoelement, and to secure it to the measuring object.

Figure 9:
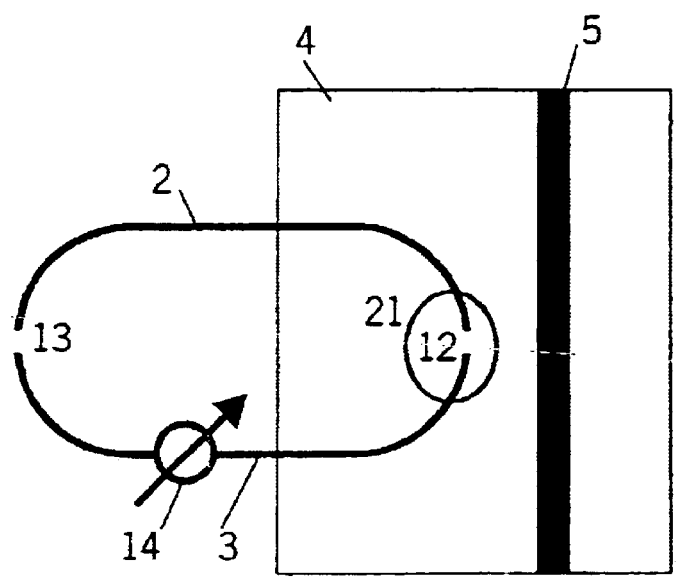
FIG. 9 a schematic diagram of a thermoelement mounted on a laser chip.

As is evident in FIG. 9 from the arrangement of a thermoelement on a laser chip 4, each thermoelement, shown here as measuring point 12, now has one measuring lead wire 2 and one measuring lead wire 3, each of different material.

Before joining wires 2 and 3 on laser chip 4, it is particularly advantageous to vapor-deposit a contact surface 21 on semiconductor laser 4, or to apply it in some other suitable way, this surface 21 either being made of the material of wire 2 or of the material of wire 3 (FIG. 9).

At the second place where wires 2 and 3 are united, a second thermoelement 13 is formed. At point 14, a voltage that is dependent upon the temperature difference between points 12 and 13 can then be tapped off; in this context, the measuring instrument at point 14 is surrounded by wires of the same material. Of course, wires 2 and 3 can also be partially or completely designed as printed conductors that are permanently connected to a chip (e.g., to laser chip 4). Temperature-reference point 13 can be on chip 4 itself, on heat sink 6 of semiconductor laser 4, or even on the housing surrounding the entire arrangement, in accordance with FIG. 1.

Figure 10:
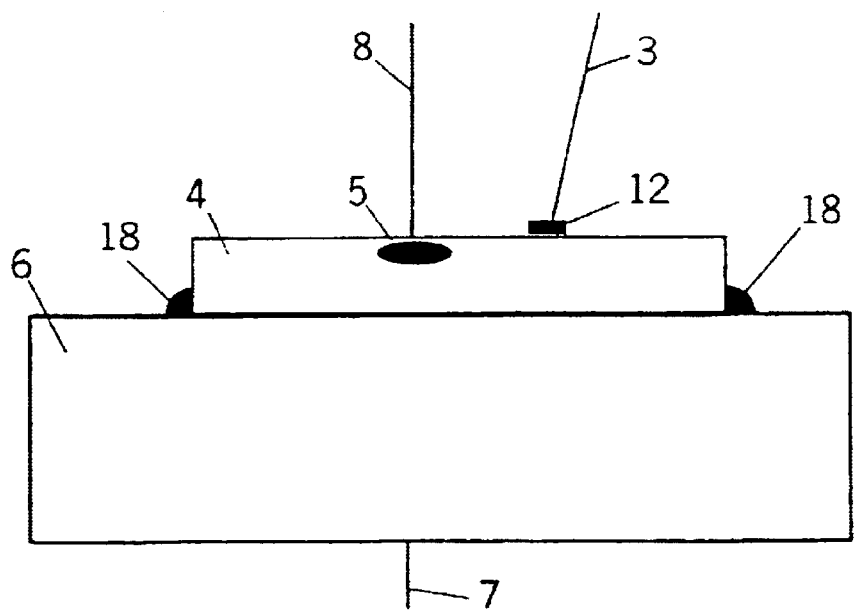
FIG. 10 a schematic diagram of a thermoelement having only one additional wire.

FIG. 10 shows a design variant that makes do with only one additional wire 3, in which the otherwise necessary wire 2 is the pumping-current lead wire 8, made, for example, of gold or copper. The other wire 3 for thermoelement 12 is made, for example, of Konstantan.

Figure 11:
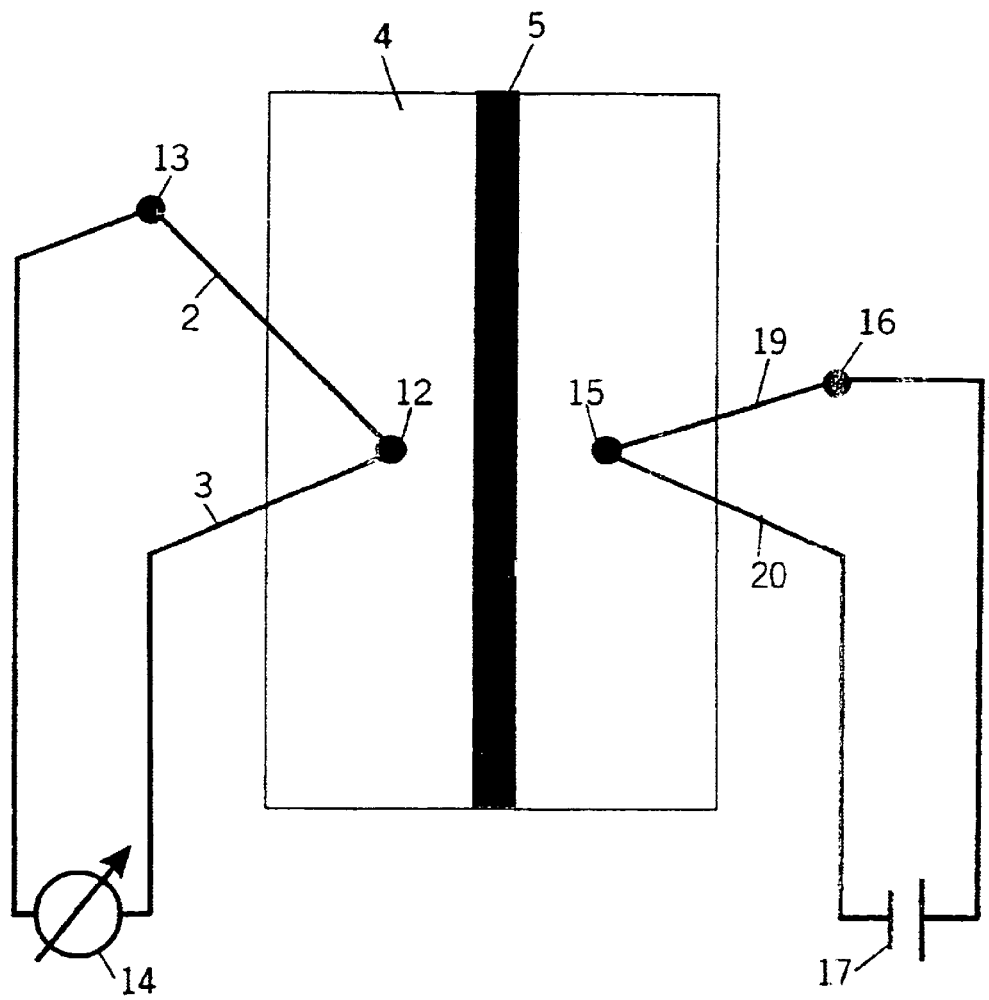
FIG. 11 a schematic diagram of an arrangement for regulating temperature using a thermoelement and a Peltier element.

A further advantage is derived in a reversed operation by using a thermoelement in accordance with FIG. 11 as a Peltier element having a current source 17. Similarly to the measuring arrangement according to FIG. 9, here as well, wires 19 and 20 between points 15 and 16 are made of different materials. Depending on the direction of the current from source 17, the heat can be transferred from point 15 to point 16 (main application case: semiconductor laser 4 is cooled) or from point 16 to point 15 (semiconductor laser 4 is additionally heated).

The Peltier element formed from wires 19 and 20 between points 15 and 16 is fabricated using the same technology as thermoelement pair 2, 3, 12, 13, described in FIG. 9.

Using a thermoelement pair functioning as a temperature sensor, in accordance with FIG. 9, and a Peltier element 15, 16, 19, 20 operated as a temperature setter, one can precisely adjust the temperature of point 15. To reduce control errors, point 15 should be close to point 12. The controller (not shown) then controls current source 17 as a function of measuring voltage 14 of thermoelement pair 12 and 13, measuring point 13 being an external reference point. In this control, it is beneficial for reference point 13 and thermal reference point 16 (in an embodiment, a heat sink) of the Peltier element to have the same temperature. This reference location 13 or 16 can be a point outside of the laser housing (for measurement as compared to ambient temperature). However, it is also possible for the reference location to be placed on heat sink 6 of semiconductor laser 4 (for measurement of the differential temperature with respect to heat sink 6 of semiconductor laser 4, if indicated, with heat dissipation likewise to heat sink 6 of semiconductor laser 4).

If semiconductor laser 4 is a telecommunications laser, then its output wavelength can be very finely tuned.

Figure 12:
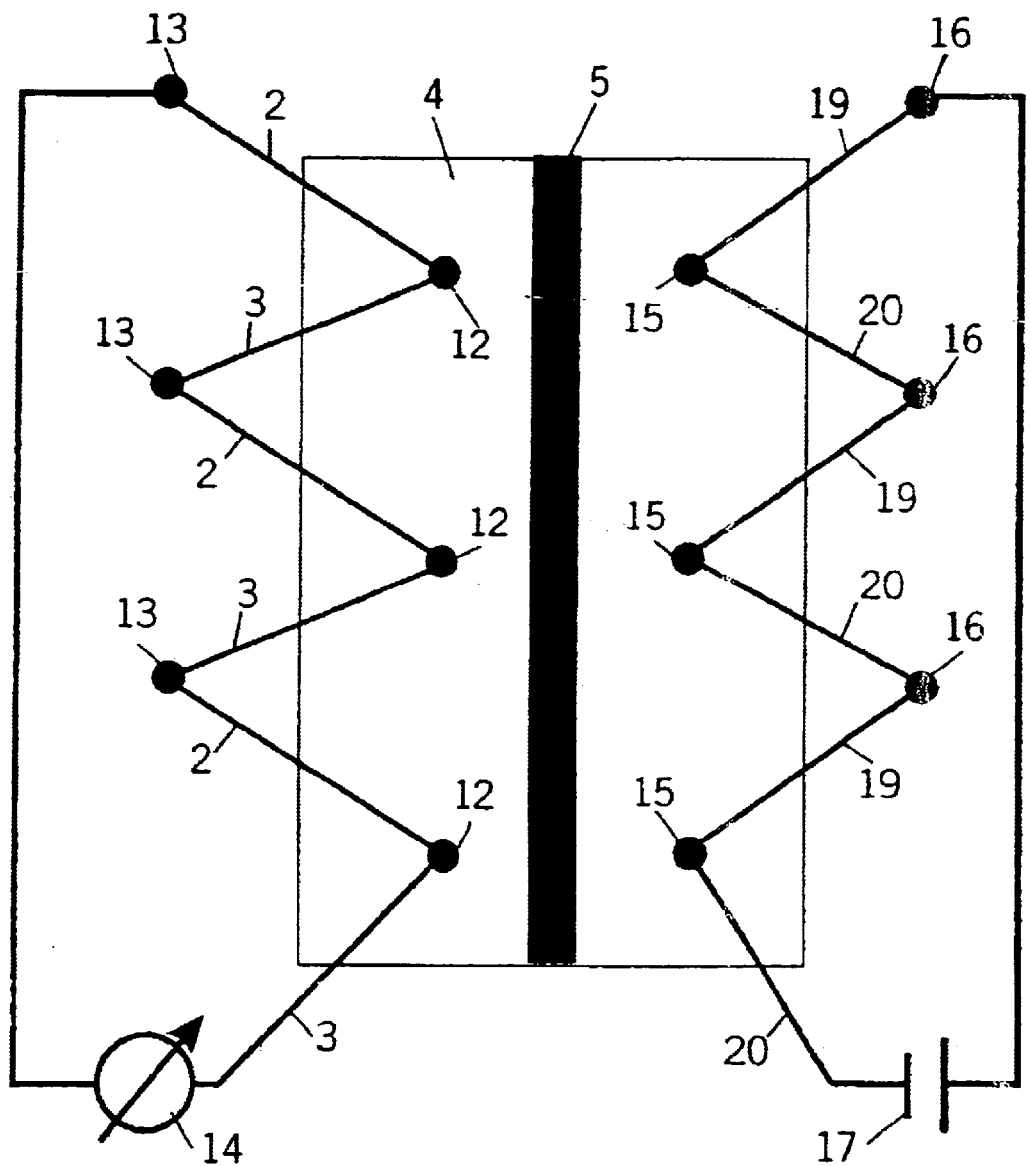
FIG. 12 a schematic diagram of a cascaded arrangement of thermoelements on a laser chip.

For very long lasers 4 (for example, high-performance lasers), it is also possible—as shown in FIG. 12—to configure both thermoelement element pairs 12 and 13, as well as Peltier elements 15 and 16, in a cascade arrangement, to achieve a more homogeneous heat dissipation.

Figure 13:
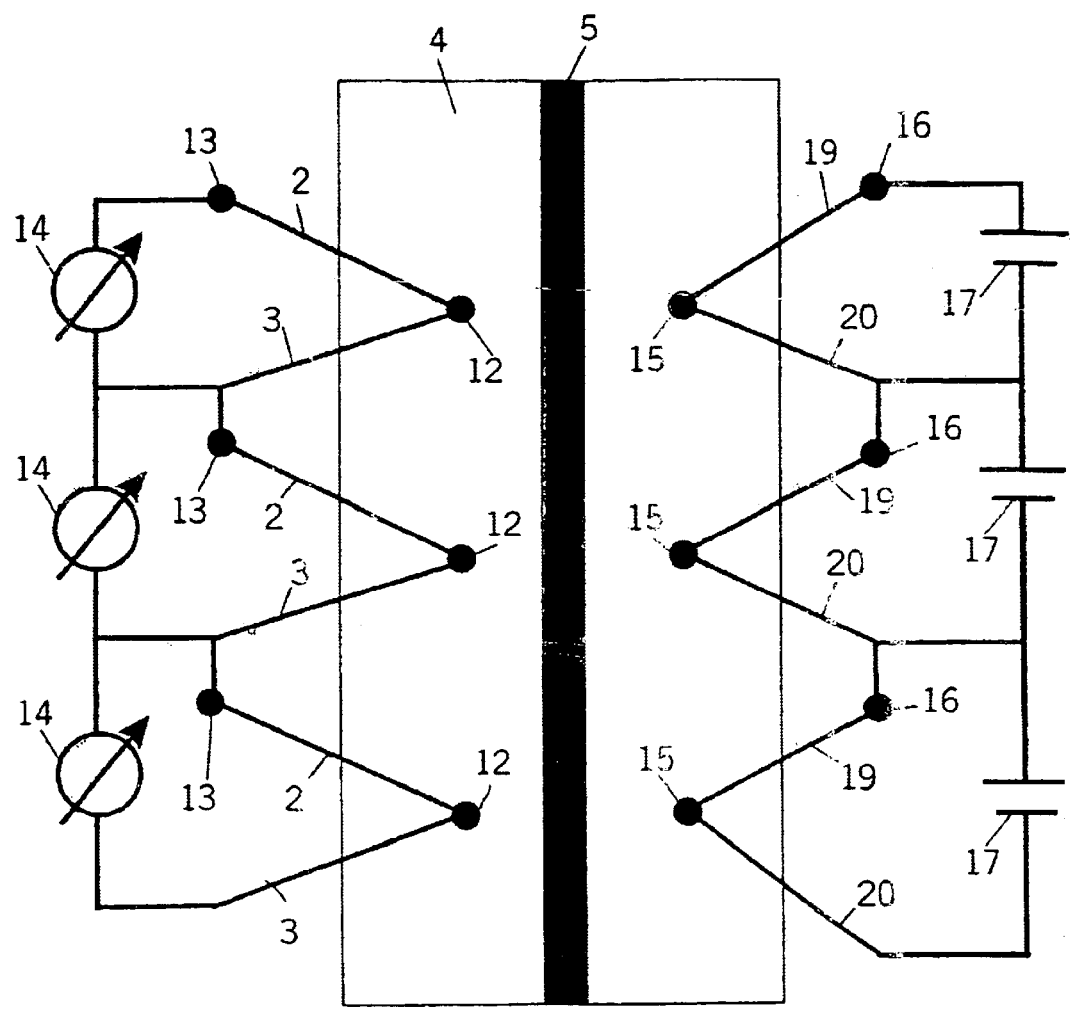
FIG. 13 a schematic diagram of an arrangement for locally selective temperature regulation.

FIG. 13 illustrates how the temperature irregularities which limit power output, in particular along the active laser zone 5, can be reduced when working with high-performance lasers, in particular. In a separate controller, each measuring voltage 14 of corresponding measuring point 12 produces its own actuating current 17 for cooling the corresponding heat-dissipation point 15. The dimensional design of the controller is especially simple, when all reference points 13 and all thermal reference points 16 have the same temperature.

When this temperature control that is selective with regard to location is used, it is possible, for example, to cool especially hot points more intensely than less hot points and, in this manner, achieve a uniform temperature characteristic along the active laser zone 5 of laser chip 4.

Using the technology described here, one can easily conceive of other refinements or arrangements derived from the particular laser chip and its application area, depending on this requirement.

What is claimed is:

1. A semiconductor laser comprising:
   a semiconductor laser chip; and
   at least one temperature sensor configured to be integrated in the semiconductor laser chip for measuring an operating temperature,
   wherein the at least one temperature sensor is secured by welding directly in the semiconductor laser chip, an energy for the welding coming from a light source, the light source including at least one of a ND-glass source, a Nd-YAG source and a source having a similar spatial distribution and similar spectral distribution to a Nd-glass source or a Nd-YAG source.

2. The semiconductor laser as recited in claim 1 wherein prior to the welding each of the at least one temperature sensor is sealed into an electrically insulating glass.

3. The semiconductor laser as recited in claim 1 wherein each of the at least one temperature sensor is arranged and secured in a respective hole, each of the respective hole being formed in the laser chip using light-welding.

4. The semiconductor laser as recited in claim 1 wherein the at least one temperature sensor is included in the semiconductor laser chip, wires for measuring an electrical resistance through the semiconductor laser chip being mounted on the semiconductor laser chip.

5. The semiconductor laser as recited in claim 4 wherein the wires for measuring the electrical resistance through the semiconductor laser chip include a pumping current lead wire and an additional wire used as a sensor supply lead.

6. The semiconductor laser as recited in claim 1 wherein the at least one temperature sensor includes a thermoelement.

7. The semiconductor laser as recited in claim 1 wherein the at least one temperature sensor includes a thermoelement having two wires joined by laser-light welding and secured in a common work step to the semiconductor laser chip.

8. The semiconductor laser as recited in claim 7 wherein a contact surface of a material of one of the wires is deposited on the semiconductor laser chip before the two wires are joined.

9. A semiconductor laser comprising:
   at least one first semiconductor laser chip;
   at least one second semiconductor laser chip, the at least one second semiconductor laser chip forming a semiconductor laser array with the at least one first semiconductor laser chip;
   at least one temperature sensor associated with the semiconductor laser chip for measuring an operating temperature, each of the at least one temperature sensor being one of disposed directly on and integrated in a respective one of the semiconductor laser chip and the at least one second semiconductor laser chip for measuring a respective operating temperature, an operating temperature of the semiconductor laser array being measurable by measuring the operating temperature of the at least one first semiconductor laser chip and the at least one second semiconductor laser chip, a respective output wavelength of the semiconductor laser chip and the at least one first semiconductor laser chip and at least one of the second semiconductor laser chip being adjustable by varying their respective pumping currents.

10. The semiconductor laser as recited in claim 1 wherein each of the at least one temperature sensor includes a respective thermoelement disposed directly on the semiconductor laser chip, each of the thermoelements being operatable in a reversed operation as a respective Peltier element having a current source for adjusting a respective temperature with local selectivity.

11. The semiconductor laser as recited in claim 10 wherein the semiconductor laser chip includes an active laser zone having at least one measuring point for measuring a wavelength of the semiconductor laser chip so as to enable an adjusting of the wavelength.

12. The semiconductor laser as recited in claim 11 wherein the semiconductor laser is included in a telecommunications laser and the semiconductor laser chip includes one measuring point in the active zone.

13. The semiconductor laser as recited in claim 11 wherein the semiconductor laser is included in a high-performance laser and the semiconductor laser chip includes a plurality of measuring points along the active laser zone.

14. The semiconductor laser as recited in claim 10 wherein the at least one temperature sensor includes at least two thermoelements operated and configured in a cascade arrangement.

15. The semiconductor laser as recited in claim 1 further comprising:
a closed-loop control circuit including a setter for adjusting the operating temperature.

16. The semiconductor laser as recited in claim 1 further comprising a respective temperature setter and a respective temperature controller associated with each of the at least one temperature sensor and disposed on the semiconductor laser chip.

17. A semiconductor laser comprising:
a semiconductor laser chip; and
at least one temperature sensor configured to be disposed directly on the semiconductor laser chip for measuring an operating temperature,
wherein the at least one temperature sensor is secured by welding directly on the semiconductor laser chip, an energy for the welding coming from a light source, the light source including at least one of a ND-glass source, a Nd-YAG source and a source having a similar spatial distribution and similar spectral distribution to a Nd-glass source or a Nd-YAG source.

18. The semiconductor laser as recited in claim 17 wherein prior to the welding each of the at least one temperature sensor is sealed into an electrically insulating glass.

19. The semiconductor laser as recited in claim 17 wherein each of the at least one temperature sensor is arranged and secured in a respective hole, each of the respective hole being formed in the laser chip using light-welding.

20. The semiconductor laser as recited in claim 17 wherein the at least one temperature sensor is included in the semiconductor laser chip, wires for measuring an electrical resistance through the semiconductor laser chip being mounted on the semiconductor laser chip.

21. The semiconductor laser as recite in claim 20 wherein the wires for measuring the electrical resistance through the semiconductor laser chip include a pumping current lead wire and an additional wire used as a sensor supply lead.

22. The semiconductor laser as recited in claim 17 wherein the at least one temperature sensor includes a thermoelement.

23. The semiconductor laser as recited in claim 17 wherein the at least one temperature sensor includes a thermoelement having two wires joined by laser-light welding and secured in a common work step to the semiconductor laser chip.

24. The semiconductor laser as recited in claim 23 wherein a contact surface of a material of one of the wires is deposited on the semiconductor laser chip before the two wires are joined.

25. The semiconductor laser as recited in claim 17 wherein each of the at least one temperature sensor includes a respective thermoelement disposed directly on the semiconductor laser chip, each of the thermoelements being operatable in a reversed operation as a respective Peltier element having a current source for adjusting a respective temperature with local selectivity.

26. The semiconductor laser as recited in claim 10 wherein the semiconductor laser chip includes an active laser zone having at least one measuring point for measuring a wavelength of the semiconductor laser chip so as to enable an adjusting of the wavelength.

27. The semiconductor laser as recited in claim 11 wherein the semiconductor laser is included in a telecommunications laser and the semiconductor laser chip includes one measuring point in the active zone.

28. The semiconductor laser as recited in claim 11 wherein the semiconductor laser is included in a high-performance laser and the semiconductor laser chip includes a plurality of measuring points along the active laser zone.

29. The semiconductor laser as recited in claim 27 wherein the at least one temperature sensor includes at least two thermoelements operated and configured in a cascade arrangement.

30. The semiconductor laser as recited in claim 17 further comprising a respective temperature setter and a respective temperature controller associated with each of the at least one temperature sensor and disposed on the semiconductor laser chip.

31. The semiconductor laser as recited in claim 9 wherein the at least one temperature sensor is disposed directly on the semiconductor laser chip for measuring an operating temperature.

32. The semiconductor laser as recited in claim 9 wherein the at least one temperature sensor is integrated in the semiconductor laser chip for measuring an operating temperature.

33. The semiconductor laser as recited in claim 15 wherein the at least one temperature sensor is disposed directly on the semiconductor laser chip for measuring an operating temperature.

34. The semiconductor laser as recited in claim 15 wherein the at least one temperature sensor is integrated in the semiconductor laser chip for measuring an operating temperature.

* * * * *